United States Patent
De Chambost et al.

(10) Patent No.: US 7,049,588 B2
(45) Date of Patent: May 23, 2006

(54) DEVICE FOR MEASURING THE EMISSION OF X-RAYS PRODUCED BY AN OBJECT EXPOSED TO AN ELECTRON BEAM

(75) Inventors: Emmanuel De Chambost, Limoures (FR); Chrystel Hombourger, Paris (FR); Juan Montero, Noisy le Grand (FR); Pierre Monsallut, Paris (FR); Pierre-Francois Staub, Paris (FR)

(73) Assignee: Cameca, Courbevoie (FR)

( * ) Notice: Subject to any disclaimer, the term of this patent is extended or adjusted under 35 U.S.C. 154(b) by 8 days.

(21) Appl. No.: 10/508,834

(22) PCT Filed: Mar. 28, 2003

(86) PCT No.: PCT/FR03/00987

§ 371 (c)(1),
(2), (4) Date: Sep. 23, 2004

(87) PCT Pub. No.: WO03/083892

PCT Pub. Date: Oct. 9, 2003

(65) Prior Publication Data

US 2005/0211898 A1   Sep. 29, 2005

(30) Foreign Application Priority Data

Mar. 29, 2002  (FR) .................................. 02 04074

(51) Int. Cl.
*H01J 37/256* (2006.01)
*G01N 23/225* (2006.01)

(52) U.S. Cl. ..................................................... 250/310
(58) Field of Classification Search ..................... None
See application file for complete search history.

(56) References Cited

U.S. PATENT DOCUMENTS

| | | | |
|---|---|---|---|
| 3,760,180 A | | 9/1973 | Weber |
| 4,288,692 A | * | 9/1981 | Schamber et al. .......... 250/310 |
| 4,330,709 A | | 5/1982 | de Chambost |
| 4,492,870 A | | 1/1985 | de Chambost et al. |
| 4,798,953 A | | 1/1989 | de Chambost |
| 4,873,455 A | | 10/1989 | de Chambost et al. |
| 4,918,318 A | | 4/1990 | de Chambost et al. |
| 5,047,655 A | | 9/1991 | Chambost et al. |
| 5,146,090 A | * | 9/1992 | Plies .......................... 250/310 |
| 5,189,304 A | | 2/1993 | De Chambost et al. |
| 5,714,757 A | | 2/1998 | Itabashi et al. |

(Continued)

FOREIGN PATENT DOCUMENTS

WO          01 95365 A     12/2001

(Continued)

*Primary Examiner*—Jack I. Berman
(74) *Attorney, Agent, or Firm*—Lowe Hauptman & Berner, LLP (57) ABSTRACT

The present invention relates to a device for measuring the X-ray emission produced by an object, or specimen, exposed to an electron beam. The device includes at least one subassembly or electron column, which is used to produce and control the electron beam, and a support for positioning the object measured. It also includes spectral analysis means for analyzing the X-rays emitted by the specimen to be analyzed and optical means for controlling the position of the specimen relative to the beam. The energy of the beam created and the intensity of the electron current obtained are used to meet the sensitivity, resolution and precision requirements demanded by semiconductor manufacturers. The invention applies especially to checking the fabrication of an integrated-circuit wafer.

20 Claims, 4 Drawing Sheets

U.S. PATENT DOCUMENTS 5,939,720 A * 8/1999 Todokoro ............ 250/310
6,259,530 B1    7/2001 Monsallut
6,936,817 B1 * 8/2005 Feuerbaum ........... 250/310

FOREIGN PATENT DOCUMENTS

WO          0195365 A    12/2001

* cited by examiner

DEVICE FOR MEASURING THE EMISSION OF X-RAYS PRODUCED BY AN OBJECT EXPOSED TO AN ELECTRON BEAM

RELATED APPLICATIONS

The present application is based on, International Application No. PCT/FR03/00987, filed on Mar. 28, 2003, entitled "DEVICE FOR MEASURING THE EMISSION OF X-RAYS PRODUCED BY AN OBJECT EXPOSED TO AN ELECTRON BEAM", which in turn corresponds to French Application No. FR 02 04074 filed on Mar. 29, 2002, and priority is hereby claimed under 35 USC 119 based on these applications. Each of these applications are hereby incorporated by reference herein in its entirety. cl FIELD OF THE INVENTION The present invention relates to a device for measuring the emission of X-rays produced by an object exposed to an electron beam. It relates especially to the production of a device for controlling the quality of fabrication of integrated circuits produced on silicon wafers. The device is intended to carry out composition and thickness measurements on the conducting and dielectric structures that make up these integrated circuits. The device is also intended to optimize the time for analyzing a wafer leaving the fabrication line. This device is especially intended to equip integrated-circuit fabrication lines.

BACKGROUND OF THE INVENTION

The need to be able to quantitatively characterize very fine structures, buried in the first nanometers of solid materials of the semiconductor type for example, has never stopped growing over the years. This is especially the case in the field of microelectronics. The increase in the speed of electronic circuits is determined by market needs. This increase in speed is accomplished, by reducing the size of these circuits and therefore of the structural elements that make up the transistors.

Thus, the minimum size of these transistors has decreased from 2 µm in 1980 to 180 nm today. The intended objective is to bring transistors having sizes of 130 nm and 100 nm into service in the coming years, and of 50 nm thereafter.

The production of such submicron transistors implies control over the steps of forming very fine structures, the thickness of which does not exceed, for example, 50 nm. In particular, two fabrication steps are very important:
  ion implantation of charge carriers, which may be carried out over a thickness already not exceeding a few nanometers before activation;
  the covering of the transistor with a gate dielectric material, in the form of a layer of material whose thickness is henceforth sometimes less than one nanometer. Thicknesses of this order represent quantities of atoms typically between $10^{13}$ and $10^{16}$ atoms per $cm^2$.

Faced with the production difficulties, semiconductor manufacturers are seeking industrial analytical devices that are capable of reliably characterizing the submicron structures produced. These devices must be sufficiently sensitive and accurate to be able to quantify and monitor, typically with a precision of within 1%, the composition and thickness characteristics of the structures fabricated. These devices must also have a resolution sufficient to allow an analytical check to be made in very small regions that are dedicated for these tests and located on the border of the electronic chips. The size of the test regions is typically of the order of 100 µm×100 µm. These devices must also establish diagnostics over times compatible with the constraints associated with the production environment. These times are, for example, of the order of a few minutes for inspecting a wafer.

Since the structures produced are becoming finer and finer, to be able to check them requires increasingly precise measurements to be carried out. As regards orders of magnitude of the measurements to be performed, the devices currently available on the market are inappropriate and of insufficient performance. This lack of performance impinges on several aspects, from the lack of precision in the quantitative results to purely and simply the lack of sensitivity.

SUMMARY OF THE INVENTION

The object of the invention is in particular to meet the requirements mentioned above. For this purpose, the subject of the invention is a device for measuring the X-ray emission produced by an object exposed to an electron beam. The invention lies within the field of the technique known internationally by the acronym EPMA (Electron Probe MicroAnalysis) that combines the bombardment of objects by an electron beam with detection of the wavelength of the X-rays produced by the electron-specimen interaction. An example of an instrument that implements the EPMA technique is the SX100 developed by the Applicant and described for example in Chapters 1 and 5 of the work entitled "Microanalyse et Microscopie électronique àbalayage" [*Microanalysis and Scanning electron microscopy*] published by Les Editions de Physique in 1979.

Within the context of the known techniques for implementing the bombardment of objects by an electron beam, mention may also be made of the Auger technique that uses a method based on analysis of the energy of the electrons emitted by the specimen analyzed. Mention may especially be made in this regard of U.S. Pat. No. 3,760,180 A filed by Siemens and granted on Sep. 18, 1973. That patent discloses an instrumentation, combining electron optics means to bombard the specimen, and an Auger-type electron energy analyzer.

This device mainly comprises:
  a subassembly comprising electron emission means and an acceleration stage in which the electrons are subjected to a potential difference $\Delta V1$;
  a space with no electric field in which the electron beam is shaped and controlled;
  a deceleration phase in which the electrons are subjected to a potential difference $\Delta V2$ of opposite sign to $\Delta V1$;
  a support for positioning the object beneath the electron beam; and
  spectral analysis means for analyzing the X-rays emitted by the object being analyzed.

This device has the advantage of emitting a narrow electron beam, compatible with the abovementioned resolution constraints.

The electron beam exhibits little dispersion, thereby ensuring good illumination precision.

The depth of penetration of the electron beam into the material to be analyzed can be adjusted and advantageously makes it possible to obtain a sensitivity compatible with the constraints associated with the fineness of the layers analyzed.

The intensity of the electron current produced also allows the sensitivity of the device to be increased.

BRIEF DESCRIPTION OF THE DRAWING

Other features and advantages of the invention will become apparent from the description that follows, given with regard to the appended figures which show.

DETAILED DESCRIPTION OF THE INVENTION

Figure 1:
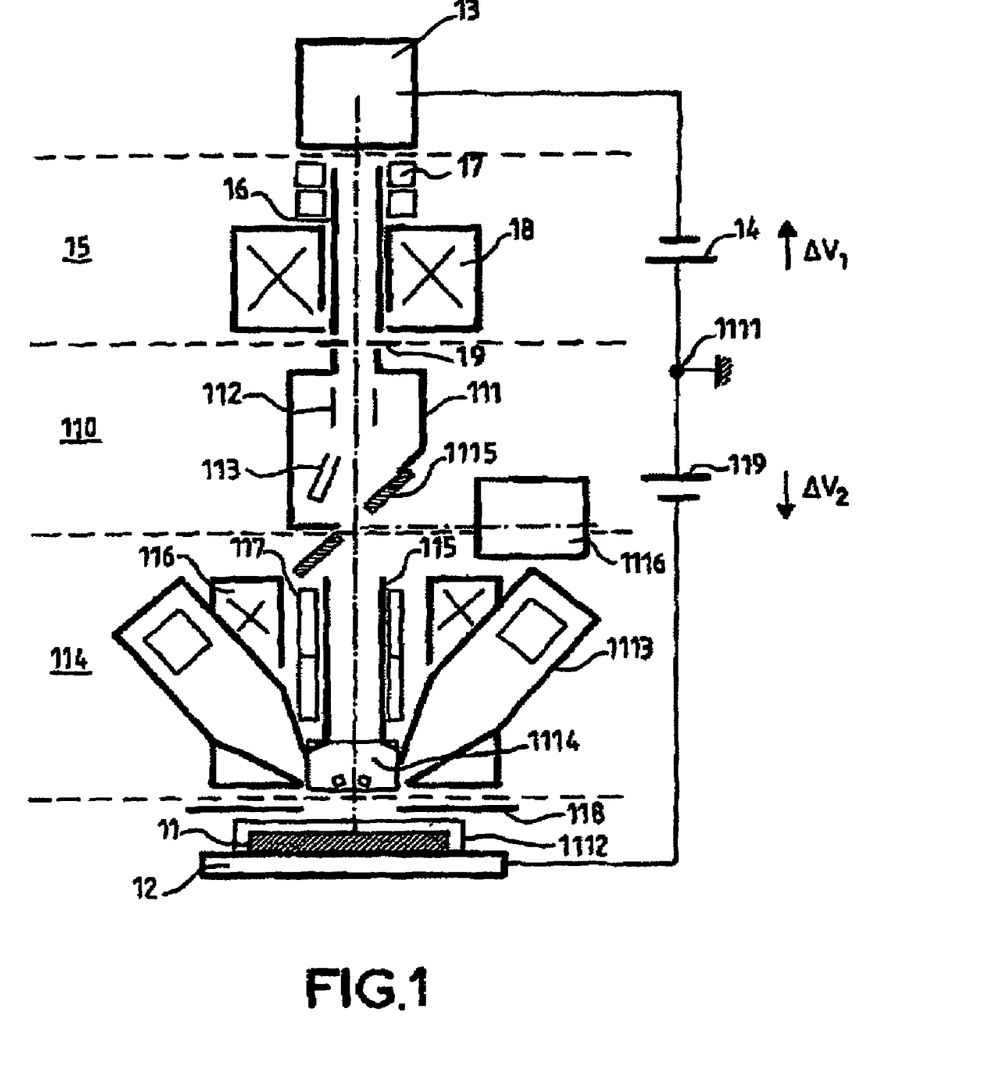
FIG. 1, a schematic representation of the device.

The device according to the invention is shown in FIG. 1. It mainly comprises a subassembly, called an electron column, intended for the emission, shaping and control of the electron beam, a subassembly that carries out the spectral analysis of the X-ray emissions characteristic of the object scanned, and a specimen support 12 on which the specimen 11 to be analyzed is placed. It also includes an optical subassembly for displaying the specimen 11. Other subassemblies may be integrated into the device, in order to carry out ancillary or complementary functions such as, in particular, automatic control means or else means for modifying the position of the specimen relative to the beam. The entire device is placed in a chamber, not shown in the figure, in which a relatively high vacuum is created, depending on the requirements.

The electron column comprises several parts, each part itself comprising several elements.

The subassembly 13 for the emission and acceleration of the electron beam is that element of the column located furthermost upstream. It comprises in particular an electron source raised to a potential HV1 and an electron acceleration stage. The electron source may be of various types, especially a cold field-emission source, a point-cathode Schottky source or a thermionic cathode source. The potential HV1 is applied to the source by means of a generator 14. In the acceleration stage, the electrons are subjected to a potential difference $\Delta V1$, equal for example to the voltage delivered by the generator 14. This potential difference is such that it creates an electric field that accelerates the electrons emitted by the source.

The electrons thus accelerated leave the emission subassembly 13 and enter a space subjected to a substantial zero electric field, in which their energy is kept practically constant. The electron beam is shaped in and propagates through this field-free space. This field-free space itself comprises several zones.

A first, beam-shaping zone 15 lies immediately downstream of the emission device. This zone is surrounded by an internally metallized enclosure 16 which may for example take the form of a tube. This enclosure is raised to the reference potential 1111 of the generator 14. The reference potential may for example be the ground of the entire device according to the invention.

Placed around the enclosure 16, just downstream of the source, are deflector elements 17, for example magnetic deflectors, the role of which is to adjust the position or direction of the electron beam.

Also placed around the enclosure 16 is a magnetic lens 18 which allows the electron beam to be given a tubular, unfocussed shape in which the electrons follow parallel paths.

Placed at the exit of the chamber 16 is a diaphragm 19, the function of which is to limit the diameter of the electron beam. The purpose of thus limiting the beam diameter is to ensure that the diameter of the beam that strikes the plane of the specimen does not exceed the desired maximum value. This maximum diameter is, for example, that required by the spectral resolution of the spectrometers or the spatial resolution needed for the measurement. This diaphragm may be a single element with an aperture of fixed diameter. It may also consist of a set of switchable diaphragms, having different aperture diameters. Switching diaphragms of different diameters is an advantageous means that allows the intensity of the beam to be varied without modifying the characteristics of the electron source.

The space with no electric field comprises a second zone 110 for measuring the electron current. This zone is, for example, located downstream of the diaphragm. It is surrounded by a conducting enclosure 111 raised like the enclosure 16 to the reference potential of the generator 14.

Inside the enclosure 111, deflection means 112 are placed around the beam. These deflection means are intended to deflect the beam from its normal path onto the specimen to be analyzed. The beam thus deflected is directed onto a device 113 that measures the electron flux density. This electron capture device, for example of the Faraday well type, is also placed in the enclosure 111 and electrically isolated. The deflection means 112, which may for example be magnetic coils or electrostatic plates, are brought into use periodically. This makes it possible advantageously to carry out a periodic measurement of the electron current. The choice of deflection means used depends on the measurement rate and speed that are desired. To actuate these deflection means, the invention also includes a control device having very short turn-on and turn-off times. This device (not shown in the figure) allows the beam to be periodically deflected for a short time so as to take current measurements while the beam is being used. Thus, with switching times for example of less than 1 microsecond, it is possible to take a measurement lasting one millisecond every tenth of a second. Measurement of the beam intensity is therefore obtained by sampling. Experience shows that if an intensity measurement is performed over 1% of the time, the measurement is sufficiently accurate and leaves the beam available for analysis over 99% of the time.

The enclosure 111 contains the electron current measurement means. It is therefore advantageous to place the enclosure downstream of any element intended to limit the beam size, such as a diaphragm. Thus, the measured beam current is the same as the beam current that reaches the specimen.

The space with no electric field comprises a third zone 114 for focusing the beam. This zone is, for example, located downstream of the zone 110 described above. This zone is surrounded by a conducting enclosure 115 that surrounds the beam and is raised, like the enclosures 16 and 111, to the reference potential of the generator 14.

Placed around the enclosure 115 is a magnetic lens 116 whose role is to focus the electron beam onto a point on the surface of the specimen to be analyzed. This lens may be regarded, by optical analogy, as the objective of the system.

It is possible to place deflectors between the lens 116 and the enclosure 115 surrounding the beam. These deflector devices 117 may serve to position the beam on the specimen or to move it over the specimen in order to carry out a scan.

As soon as the beam exits the enclosure 115, it leaves the space with no electric field and approaches the specimen to be analyzed, with an energy substantially identical to its initial energy.

Downstream of the enclosure 115, the device according to the invention comprises a perforated plate 118 that may be cooled, for example by means of a flow of liquid nitrogen. By cooling this plate, it is possible in particular to improve, by condensation, the quality of the vacuum near the specimen.

After it has passed through the plate 118, the electron beam leaves the electron column and terminates its travel by bombarding the specimen 11 to be analyzed.

As shown in FIG. 1, the specimen to be analyzed is placed on a support 12, which is a conducting element. The specimen is raised to a potential HV2 of the same sign as the potential HV1 by means of a generator 119. The reference potential of the generator 119 is connected to that of the generator 14. In this way, the voltage ΔV2 applied between the specimen 11 and the enclosure 115 is of the same sign as the voltage ΔV1 applied to the electron emission device.

As soon as it leaves the space with no electric field and just before the zone of impact with the specimen, the electron beam is therefore subjected to a retarding electric field whose action is to decelerate the electrons and therefore reduce their energy. The potential difference HV1-HV2 between the electron source 13 and the specimen 11 is adjusted, for example, by varying the value of the voltage ΔV2. It is thus possible to choose to vary the decelerating value to which the electrons are subjected by simply varying the value of ΔV2. It is therefore advantageously possible by varying the value of the potential difference HV1–HV2, to adjust the value of the impact energy of the electron beam on the specimen and therefore its depth of penetration.

Another advantage associated with the creation of the retarding field after the final focusing lens is the considerable increase in the electron current density that results therefrom. The increase in the electron current density has the advantage of increasing the sensitivity of the device. This increase in the electron current density derives from limiting the size of the beam aberration zone. The aberration zone is created by the beam passing through the lens 116.

The plate 118 may also be conducting and comprise an electrode for bringing it to a potential that may, for example, vary between ground potential and the potential HV2 of the specimen 11. If for example the plate 118 is raised to the potential HV2, the zone located between this plate and the specimen also becomes a zone with no electric field. This makes it possible advantageously to prevent the creation of a flux of ions liable to erode the surface of the specimen during the analysis. Such erosion would consequently falsify the results.

The specimen 11 to be analyzed is placed on the support 12 inside an enclosure 1112, or object chamber, that is permeable to X-rays. The support can for example be moved so as to allow optimum positioning of the object to be analyzed beneath the electron beam.

The object chamber 1112, in which the specimen is housed, is itself placed in a high, dry vacuum, of the order of $10^{-7}$ to $10^{-8}$ torr. This vacuum is, for example, created by using a turbomolecular pump assisted by a titanium sublimator. A microleak is placed above the specimen. Its role is to allow injection, in certain cases, of any particular gas and to locally degrade the vacuum. This promotes the removal of electrostatic charges and any residual contaminating elements that may be trapped on the surface of the specimen.

To characterize the emission of X-rays characteristic of the specimen analyzed, the device according to the invention includes spectral analysis means 113. These means are, for example, WDS-type X-ray detector spectrometers, known elsewhere. By way of example, FIG. 1 has detectors placed in the zone 114 of the field-free space so as to be inclined around the enclosure 115. The base of these detectors is incorporated into the magnetic lens 116.

The device according to the invention also includes optical means for observing the specimen. Thanks to this observation, it is for example possible to determine the appropriate position, heightwise, of the specimen so as always to have the highest efficiency of the spectrometers 1113. These optical means comprise especially a catadioptric objective 1114, a deflection mirror 1115, pierced so as to allow the electron beam to pass through it, and an external optic 1116.

Figure 2:
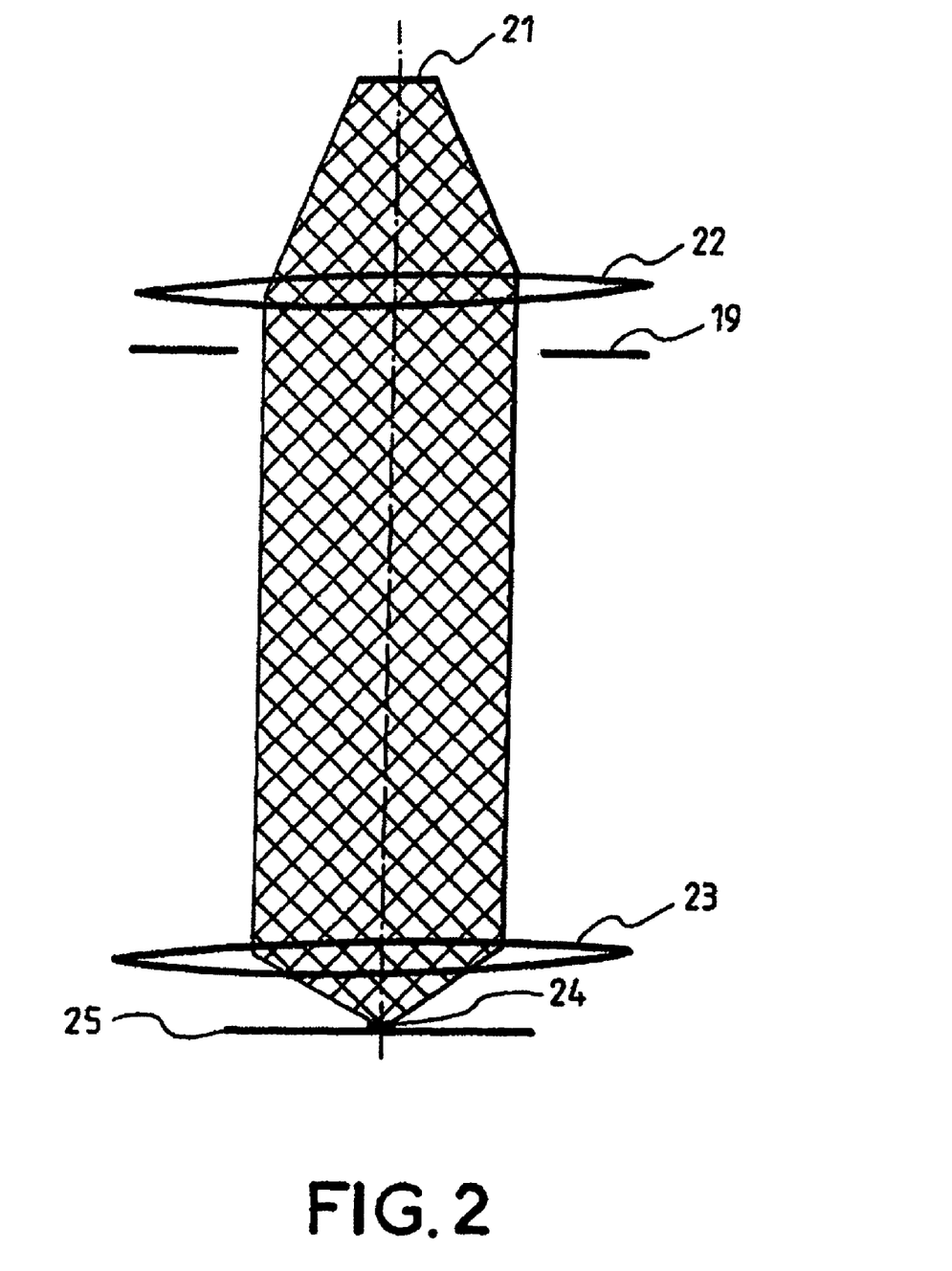
FIG. 2, a schematic representation of the path of the electron beam.

FIG. 2 of the document shows schematically, by optical analogy, the appearance of the electron beam created by the device according to the invention. In this diagram, the electromagnetic lenses 18 and 116 of FIG. 1 are represented by their optical equivalents 22 and 23. These two lenses form an afocal system within which the beam is almost parallel. The beam thus created does not have a crossover zone and has the advantage of exhibiting less aberration due to interactions between electrons. This beam aberration phenomenon, that results from interactions between electrons, is also known as the Boersch effect.

The relative distances of the various elements are chosen according to the size of the beam that it is desired to obtain in the plane of the specimen to be analyzed. If for example the distance between the source 21 and the lens 22 is four times greater than the distance between the lens 22 and the lens 23, the optical system generates, on the specimen, an image 24 of the source reduced by a factor of 4. Thus, if the actual source represented by the ideal source 21 has a typical diameter of 60 μm, the image of this source formed in the plane of the specimen will be about 15 μm.

Figure 3:
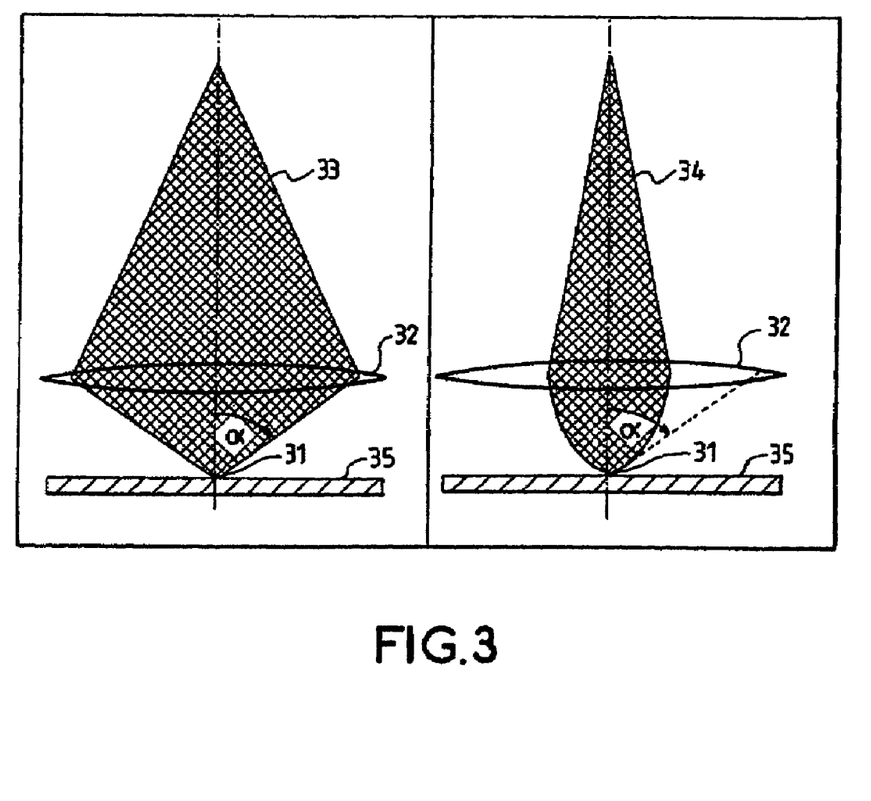
FIG. 3, an illustration of the action of the retarding field on an electron beam.

FIG. 3 of the document explains in an imaged manner the action of the retarding field on an electron beam. The figure shows the path through a lens of an electron beam emitted by a point source and its image or spot 31 on a plane 35. In the illustration on the left, the beam 33 is not subjected to any retarding field, while in the illustration on the right such a field is applied to the beam 34.

It is known that, in an electron optics system, as long as it is assumed that the lens aberrations are negligible compared with the diameter of the spot 31 in question, the current density of the spot is given by:

$$J(\text{in } A/cm^2) = \beta \pi \alpha^2 \quad (1)$$

where α is the half-angle of the beam and β is the brightness of the beam. To a first approximation, β depends only on the electron source, characterized by $\beta_0$, and on the energy carried by these electrons, which is defined by the acceleration potential V. The following expression may thus be written:

$$\beta = \beta_0 V \quad (2).$$

To have a maximum current density, it is necessary to work with the largest possible half-angle α, using the lens 32 over its entire section. This has the consequence in particular that, with respect to the lens, the diameter of the beam 33 is therefore no longer equal to the Gaussian diameter $D_0$, for which the beam passes through the lens without any aberration. It is equal to an actual diameter $D_a$ that is determined by the aberrations of the optical system. The current density of a spot is therefore given by:

$$J(\text{in } A/\text{cm}^2) = \beta\pi\alpha^2(D_0/D_a)^2 \quad (3).$$

To a first approximation, the spherical aberration and the chromatic aberration depend on a fraction of the section of the objective lens 116 through which the beam passes. As regards β, this depends only on the impact energy characterized by V. In the two cases illustrated, the impact energy of an electron $E_0$ is the same. It is given by:

$$E_0 = eV \quad (4),$$

where e represents the modulus of the electron charge and V the potential difference to which the electron is subjected.

In the situation on the left, there is no retarding field between the lens 32 and the plane 35—the energy of the electrons is equal to $E_0$ over the entire path. In the situation on the right however, there is a retarding field, the presence of which increases the energy of the electrons before the lens. This increase in energy results in a reduction in the size of the beam, however the half-angle α of the beam 34 after the lens remains the same. From the brightness law, the electron currents will be identical, whereas the section of the lens 32 through which the beam 34 passes is, in the second case, greatly reduced. The diameter of the aberration zone is therefore also reduced, thereby advantageously resulting in a much higher current density. Considering for example electrons with an energy of 500 eV raised, by means of the retarding field, to 5000 eV before the lens, the current density obtained is four times higher than that in the case in which the electrons are conveyed, without a retarding field, with an energy of 500 eV over the entire path.

Apart from the operational elements described above, the device according to the invention may include a subassembly, for example an electronic one, whose role is to automate all the commands serving for controlling the various elements that make up the device.

Figure 4:
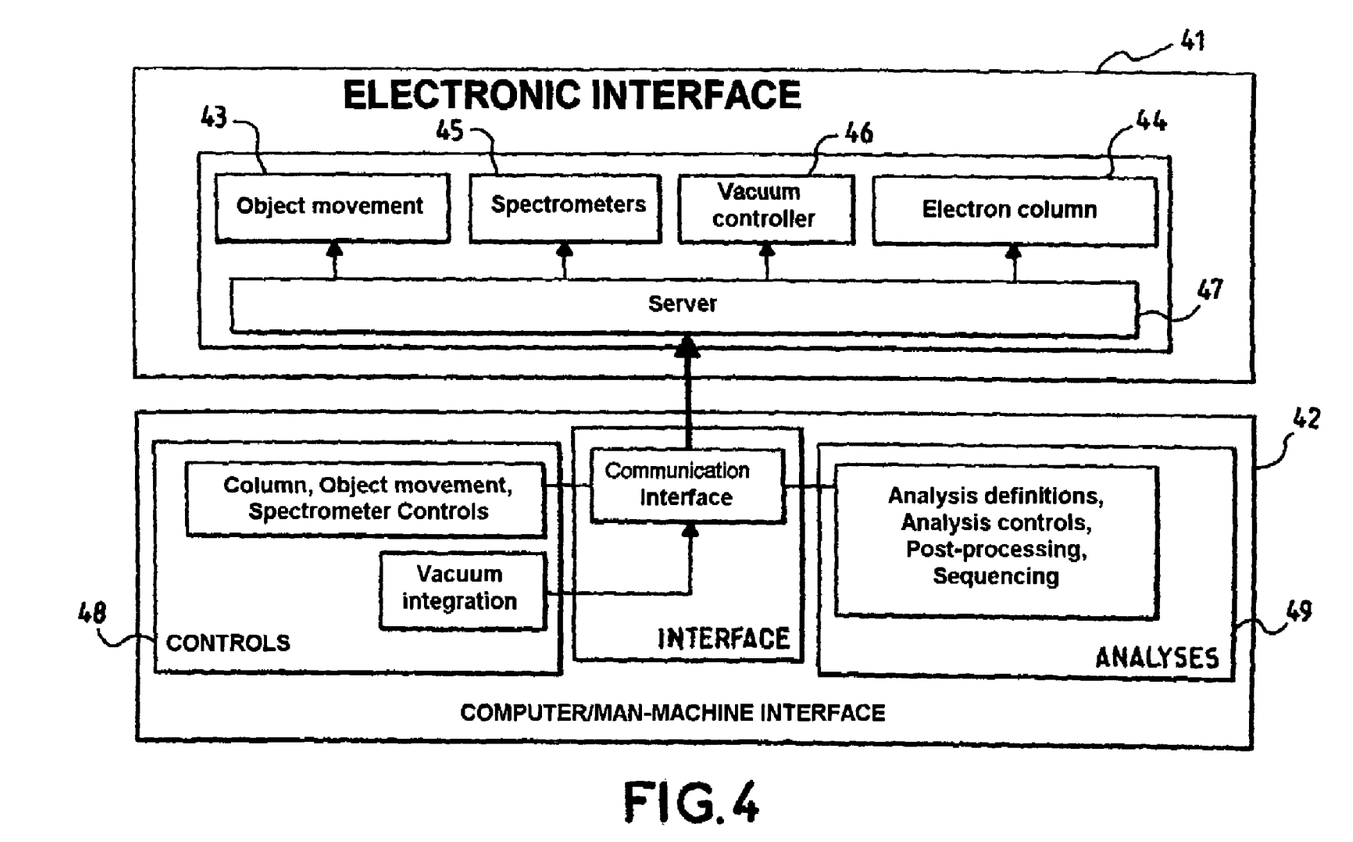
FIG. 4, one possible architecture of a system for automating the device.

FIG. 4 shows one possible architecture for such a subassembly. The subassembly shown is composed of two elements—an interface 41 and a computer 42.

The interface comprises, for example, electronic cards, each having the function of controlling one of the major functions of the device.

Thus there are:

an electronic card 43 responsible for controlling the movements of the specimen to be analyzed;

an electronic card 44 for controlling the various elements of the electron column;

an electronic card 45 responsible for operating the spectrometers; and an electronic card 46 for controlling the vacuum in the device.

The interface communicates with the computer 42 via an electronic server card 47 which interprets the orders sent by the computer.

The computer is a user workstation, for example a PC operating in a Windows environment. It is equipped with a graphics man-machine interface that allows the operator to access, in particular, a means 48 for interactively controlling the device and a means 49 for managing the automatic analysis sequences.

The device according to the invention is associated with an analytical protocol for obtaining quantitative results as regards the elemental composition of the specimen. This protocol consists in making intensity measurements of the X-rays characteristic of the elements present in the specimen. The results are obtained by varying the incident energy of the primary electrons and then by quantitatively interpreting these measurements using an appropriate simulation model. The energy of the primary electrons is controlled by applying suitable potentials to the specimen and the source. The measurements of the beam current and of the emitted X-ray photon flux constitute an acquisition by the automatic system described above. The measurement results are output by the computer in a table consisting of N rows. Each row of the table groups together all the data relating to one measurement. At each measurement instant, there is therefore a row grouping together the data associated therewith. This data comprises, for example, the measurement instant, the electron impact energy calculated from the difference HV2−HV1, together with the measurement of the beam current, measured by sampling by the electron capture device, and the accumulation of X-ray photons measured on each of the spectrometers.

Thus, it is possible, for example during an analysis, to vary, manually or automatically, the value of the impact energy of the beam and to exploit the results obtained using suitable digital processing. The essential attributes of a particular structure of the specimen analyzed can therefore by determined. These attributes are, for example, its thickness, the integrated dose, that is to say the number of atoms implanted per unit area, or the depthwise distribution of the element measured.

The elemental measurements carried out here may of course be reproduced over all the test points of a wafer-type structure. Automation therefore advantageously allows complete analysis of a wafer to be effected in a precise manner and without manual intervention.

The invention claimed is:

1. A device for measuring the X-ray emission produced by an object exposed to an electron beam, including:

a subassembly including electron emission means and an acceleration stage in which the electrons are subjected to a potential difference ΔV1;

a space with no electric field in which the electron beam is shaped and controlled by suitable means;

a deceleration phase in which the electrons are subjected to a potential difference ΔV2 of the same sign as ΔV1;

a support for positioning the object beneath the electron beam; and spectral analysis means for analyzing the X-rays emitted by the object being analyzed.

2. The device as claimed in claim 1, wherein that the potential differences ΔV1 and ΔV2 are applied using two generators, the reference potentials of which are connected together, the first generator raising the electron emission source to the potential HV1 and the second generator raising the object to be analyzed to the potential HV2.

3. The device as claimed in claim 2, wherein the reference potentials of the two generators are connected to the ground of the device.

4. The device as claimed in claim 2, wherein the space with no electric field includes enclosures that are raised to the reference potential of the two generators.

5. The device as claimed in claim 1, wherein it includes an electrode placed between the specimen support and the rest of the device, this electrode being able to be raised to any potential.

6. The device as claimed in claim 5, wherein this electrode is a perforated plate, which can be cooled.

7. The device as claimed in claim 1, wherein the space with no electric field contains means for measuring the intensity of the beam current.

8. The device as claimed in claim 7, wherein the means for measuring the intensity of the beam current are associated with electron beam deflection means, these deflection means allowing the beam to be directed onto the means for measuring the electron current.

9. The device as claimed in claim 8, wherein the deflection means are activated by a rapid electronic system, allowing the measurement to be performed by sampling, during analysis.

10. The device as claimed in claim 1, wherein the spectral analysis means comprise at least one WDS spectrometer.

11. The device as claimed in claim 1, wherein it includes an object chamber placed in a high-dry vacuum.

12. The device as claimed in claim 11, wherein the object chamber includes a microleak.

13. The device as claimed in claim 1, wherein it includes optical means for displaying the object analyzed.

14. The device as claimed in claim 12, wherein the optical means include at least one catadioptric optic placed near the object, a pierced deflection mirror and an external optical system.

15. The device as claimed in claim 1, wherein it includes an electronic command and acquisition interface connected to the various elements of the device, allowing remote control of the device and acquisition of the data corresponding to the measurements carried out.

16. The device as claimed in claim 15, wherein it includes a computer connected to the electronic interface and equipped with a man-machine interface for remotely controlling the various elements of the device and for automatically exploiting the measurements made.

17. The device as claimed in claim 3, wherein the space with no electric field includes enclosures that are raised to the reference potential of the two generators.

18. The device as claimed in claim 2, wherein the space with no electric field contains means for measuring the intensity of the beam current.

19. The device as claimed in claim 2, wherein the spectral analysis means comprise at least one WDS spectrometer.

20. The device as claimed in claim 2, wherein it includes an electronic command and acquisition interface connected to the various elements of the device, allowing remote control of the device and acquisition of the data corresponding to the measurements carried out.

* * * * *